United States Patent
Jackson et al.

(10) Patent No.: US 9,565,675 B2
(45) Date of Patent: Feb. 7, 2017

(54) FIXED INTERMEDIATE FREQUENCY SIGNAL WITH TUNED LOW FREQUENCY LOCAL OSCILLATOR REFERENCE FOR LINEAR TRANSMITTER

(71) Applicant: Hughes Network Systems, LLC, Germantown, MD (US)

(72) Inventors: Thomas Jackson, Monrovia, MD (US); Rajesh Joshi, Clarksburg, MD (US); Michael Dauberman, Germantown, MD (US)

(73) Assignee: Hughes Network Systems L.L.C., Germantown, MD (US)

( * ) Notice: Subject to any disclaimer, the term of this patent is extended or adjusted under 35 U.S.C. 154(b) by 47 days.

(21) Appl. No.: 14/498,200

(22) Filed: Sep. 26, 2014

(65) Prior Publication Data

US 2016/0095116 A1    Mar. 31, 2016

(51) Int. Cl.
| | | |
|---|---|---|
| *H04W 72/04* | (2009.01) | |
| *H04W 72/00* | (2009.01) | |
| *H04B 7/15* | (2006.01) | |
| *H04B 7/185* | (2006.01) | |
| *H04B 1/16* | (2006.01) | |

(52) U.S. Cl.
CPC .......... *H04W 72/0453* (2013.01); *H04B 1/16* (2013.01); *H04B 7/15* (2013.01); *H04B 7/185* (2013.01); *H04W 72/00* (2013.01)

(58) Field of Classification Search
CPC .... H03D 7/1441; H03D 7/1458; H03D 7/165; H03D 7/1475; H03D 7/1466; H03D 7/00; H04B 7/18517; H04B 7/15; H04B 1/0021; H04W 72/00; H04W 72/0453
See application file for complete search history.

(56) References Cited

U.S. PATENT DOCUMENTS

| | | | |
|---|---|---|---|
| 4,352,209 A * | 9/1982 | Ma .................... | H03B 5/1203 455/182.1 |
| 5,524,281 A | 6/1996 | Bradley et al. | |
| 5,826,183 A * | 10/1998 | Apel .................... | H03B 19/14 327/122 |
| 7,035,617 B2 * | 4/2006 | Buer .................... | H04B 1/26 331/96 |
| 7,660,374 B2 * | 2/2010 | Casabona ............ | G01S 19/21 375/144 |
| 8,731,030 B1 | 5/2014 | McDonald et al. | |

(Continued)

OTHER PUBLICATIONS

International Search Report for corresponding PCT application PCT/US2015/051395.

*Primary Examiner* — Yee Lam
(74) *Attorney, Agent, or Firm* — Capitol City TechLaw; Jasbir Singh

(57) ABSTRACT

A linear technology radio for use in satellite communication is provided. The linear technology radio includes: a pre-amplifier to amplify a Local Oscillator (LO) reference signal; an intermediate frequency (IF) amplifier to amplify an IF signal; a frequency multiplier to multiply the LO reference signal; and a mixer to mix the amplified LO reference signal and the amplified IF signal to generate a Radio Frequency (RF) signal, wherein a frequency band of the IF signal is fixed, a frequency band of the LO reference signal is variable, and a highest frequency of the LO reference signal frequency band is less than a lowest frequency of the IF signal frequency band.

18 Claims, 2 Drawing Sheets

(56) References Cited

U.S. PATENT DOCUMENTS

| | | | |
|---|---|---|---|
| 2002/0039885 A1* | 4/2002 | Weissman | H04B 7/2606 455/20 |
| 2002/0102951 A1* | 8/2002 | Nakano | H03D 7/00 455/118 |
| 2004/0203528 A1 | 10/2004 | Ammar et al. | |
| 2006/0160500 A1 | 7/2006 | Ammar | |
| 2008/0268806 A1* | 10/2008 | Durtschi | H04B 1/0021 455/313 |
| 2009/0015352 A1 | 1/2009 | Goebel et al. | |
| 2010/0117693 A1 | 5/2010 | Lorg et al. | |
| 2010/0172446 A1 | 7/2010 | Popoli | |

* cited by examiner

FIXED INTERMEDIATE FREQUENCY SIGNAL WITH TUNED LOW FREQUENCY LOCAL OSCILLATOR REFERENCE FOR LINEAR TRANSMITTER

FIELD OF THE INVENTION

The invention relates to a Very Small Aperture Terminal (VSAT) product or any other radio application in which a wide frequency range is to be covered for receiving and transmitting. In particular, embodiments relate to a method and a modem for using variable Local Oscillator (LO) reference signal frequencies and a fixed Intermediate Frequency (IF) signal frequency. Using this new frequency plan, a product, for example, a 28.1 to 30 GHz capable product reduces the necessary bandwidth between the Indoor Unit and outdoor unit by a factor of approximately 128.

BACKGROUND

Prior Technologies use a variable Intermediate Frequency (IF) signal frequencies, and a fixed Local Oscillator (LO) reference signal frequency. The variable IF signal requires a lot of available bandwidth on the Inter-Facility Link (IFL) between the Indoor Unit and Outdoor Radio.

FIG. 1A illustrates a frequency plan used by a prior art VSAT terminal communicating over two inter-facility link (IFL) cables between a modem and radio equipment using linear radio technology. The IFL may transmit signals over a spectrum 112 using a first of the two IFL cables from an indoor modem to an outdoor unit, where the signals include a DC power 100 signal, a low frequency Local Oscillator (LO) reference signal 104 at 10 MHz and an IF reference signal 106 ranging from 950 MHz to 1950 MHz. Usually, the outdoor unit receives signals at higher frequencies from a satellite (around 20 GHz), and down-converts them to L-Band signals 110 in a frequency range of 950 MHz to 2150 MHz. As the IF reference signal 106 utilizes a broad/wide frequency spectrum that overlaps with the received signals 110 from the ODU to the IDU, the first IFL cable cannot be used to transmit signals from the outdoor unit to the indoor modem without significant manipulation of either the IF reference signal 106 or the received signals 110. The prior art VSAT product uses the second of the two IFL cables to send the down-converted received signal to the IDU from the ODU because the frequency overlap of the IF reference signal 106 from the indoor modem and the received signals 110 from the outdoor unit would interfere with one another on a single IFL.

FIG. 1B illustrates a frequency plan used by a prior art VSAT terminal communicating over a single inter-facility link (IFL) from a modem to radio equipment using linear radio technology. The IFL may transmit signals from an indoor modem to an outdoor unit, where the signals include a DC power 100' signal, a low frequency Local Oscillator (LO) reference signal 104' at 10 MHz and an IF reference signal 106' ranging from 2200 MHz to 3000 MHz. Usually, the outdoor unit receives signals at higher frequencies from a satellite (around 20 GHz), and down-converts them to L-Band signals 110' in a frequency range of 950 MHz to 2150 MHz. With this prior art implementation, a guard band 120' between the RX signal 110' (950 to 2150 MHz) and the TX IF 106' (2200 to 3000 MHz) is very small, i.e., about 50 MHz, and makes the multiplexor design to separate the frequencies in both the IDU and ODU very difficult. Also, the TX IF 106' (2200 to 3000 MHz) suffers a lot more attenuation over a long cable as compared to signals at or below 2 GHz. Additionally, calibrating signal losses TX IF 106' (2200 to 3000 MHz) during installation is time consuming and more prone to error than a fixed signal, for example, a 2 GHz signal.

Some companies have developed VSAT products having only a single IFL between a VSAT system modem and outdoor radio equipment. However, the outdoor radio equipment includes expensive custom conversion chips to perform double frequency conversions in order to avoid frequency overlap of transmit and receive signals on the single IFL.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

In exemplary embodiments, a linear technology radio for use in satellite communication is provided. The linear technology radio includes: a pre-amplifier to amplify a Local Oscillator (LO) reference signal; an intermediate frequency (IF) amplifier to amplify an IF signal; a frequency multiplier to multiply the LO reference signal; and a mixer to mix the amplified LO reference signal and the amplified IF signal to generate a radio frequency (RF) signal, wherein a frequency band of the IF signal is fixed, a frequency band of the LO reference signal is variable, and a highest frequency of the LO reference signal frequency band is less than a lowest frequency of the IF signal frequency band.

In exemplary embodiments, a machine-implemented method performed by a linear technology radio is provided. The method includes amplifying a Local Oscillator (LO) reference signal; amplifying an intermediate frequency (IF) signal; frequency multiplying the LO reference signal; and mixing the amplified LO reference signal and the amplified IF signal to generate a radio frequency (RF) signal, wherein a frequency band of the IF signal is fixed, a frequency band of the low frequency reference signal is variable, and a highest frequency of the LO reference signal frequency band is less than a lowest frequency of the IF signal frequency band.

DRAWINGS

In order to describe the manner in which the above-recited and other advantages and features can be obtained, a more particular description is provided below and will be rendered by reference to specific embodiments thereof which are illustrated in the appended drawings. Understanding that these drawings depict only typical embodiments and are not therefore to be considered to be limiting of its scope, implementations will be described and explained with additional specificity and detail through the use of the accompanying drawings.

DETAILED DESCRIPTION

Embodiments are discussed in detail below. While specific implementations are discussed, it should be understood that this is done for illustration purposes only. A person skilled in the relevant art will recognize that other components and configurations may be used without parting from the spirit and scope of the subject matter of this disclosure.

In various embodiments, a modem such as, for example, a VSAT system modem, may communicate using a reference signal and an IF signal at different frequencies. For example, the reference signal may be selected from the low-frequency band, for example, from 203.90625 to 218.75 MHz. The IF signal may be selected from the intermediate frequency band, for example, a frequency of 2 GHz. The reference signal and the IF signal may be multiplexed onto a single IFL that may connect an indoor modem with an outdoor modem disposed adjacent to or within outdoor radio equipment. In exemplary embodiments, the single IFL carries a 2 GHz IF signal and the 203.90625 to 218.75 MHz reference signal to the outdoor radio equipment from the indoor modem. In exemplary embodiments, this arrangement can permit utilization of an IF range, for example, a 950 MHz to 1450 MHz, to receive signals from the outdoor radio equipment by the indoor modem. In exemplary embodiments, the reference signal and IF signal are manipulated to generate RF Output, for example, ranging from 28.1 to 30 GHz.

Figure 1A:
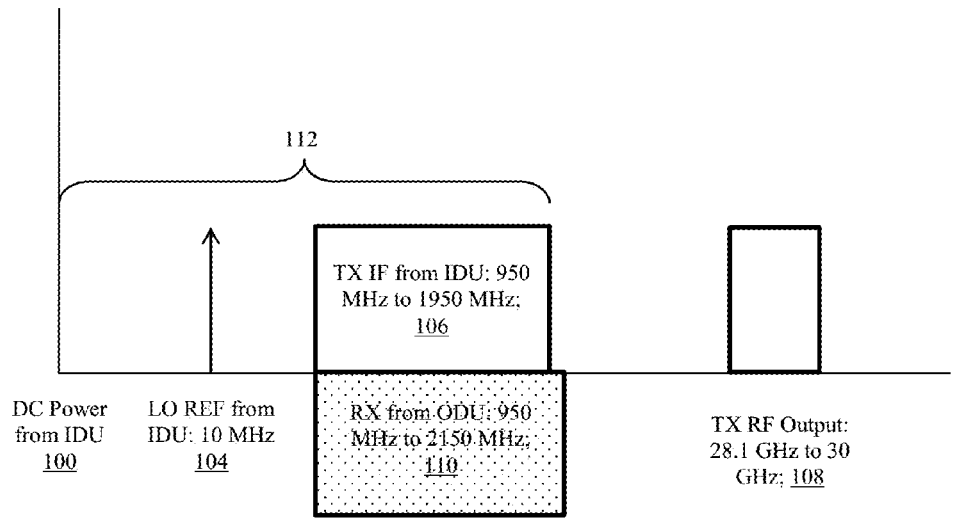
FIG. 1A illustrates a prior art frequency plan used by a VSAT terminal communicating over two inter-facility link (IFL) cables between a modem and radio equipment using linear radio technology.
Figure 1B:
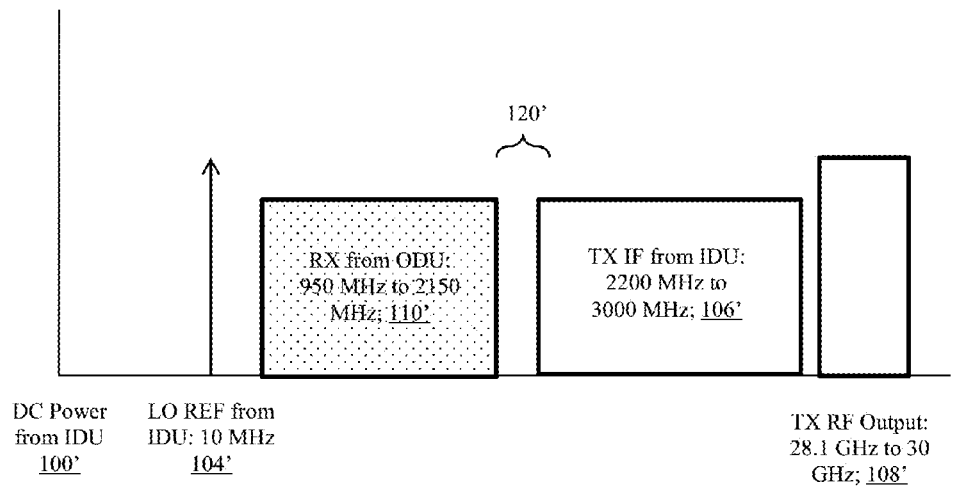
FIG. 1B illustrates a prior art frequency plan used by a VSAT terminal communicating over a single inter-facility link (IFL) between a modem and radio equipment using linear radio technology.
Figure 2:
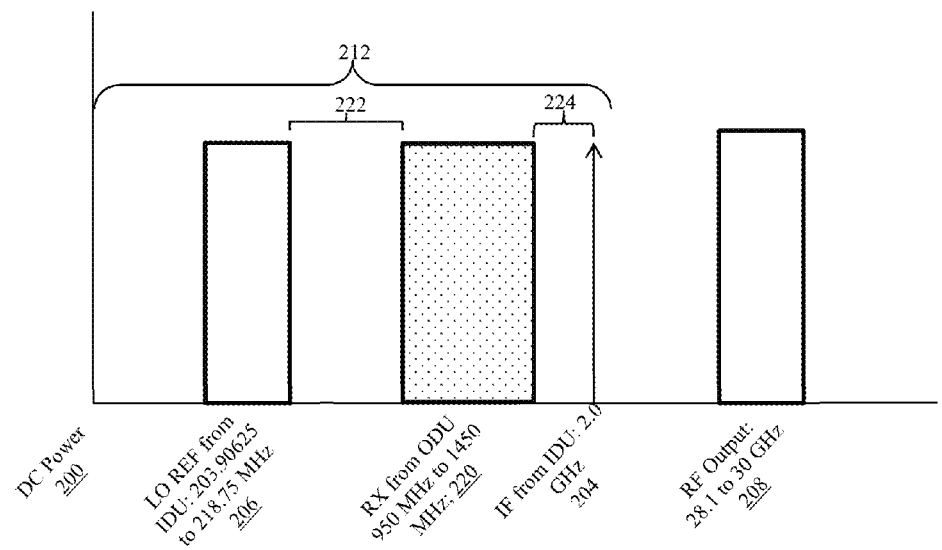
FIG. 2 illustrates a frequency plan for use by a VSAT terminal communicating over a single inter-facility link (IFL) from a modem to radio equipment using linear radio technology, according to various embodiments.

FIG. 2 illustrates a frequency plan for use by a VSAT terminal communicating over an inter-facility link (IFL) from a modem to radio equipment using linear radio technology, according to various embodiments. When using Linear Radio Technology, the present frequency plan uses a variable Low Frequency Local Oscillator reference signal and a fixed IF Carrier frequency. Fine adjustments to a low frequency local oscillator carrier provide a wide linear radio output frequency range, while keeping a fixed frequency IF Carrier signal.

In various embodiments, a modem such as, for example, a VSAT system modem, may communicate with radio equipment using linear radio technology using a reference signal 206 and an IF signal 204 at different frequencies. For example, the reference signal 206 may be disposed in the low-frequency band, for example, a sub-band of the frequency band ranging from 203.90625 to 218.75 MHz. The IF signal 204 may be selected from the intermediate frequency band, for example, a frequency of 2 GHz. The reference signal 206 and the IF signal 204 may be multiplexed onto a single IFL that may connect an indoor modem with an outdoor modem disposed adjacent to or within outdoor radio equipment. In exemplary embodiments, the single IFL carries a 2 GHz IF signal 204 and the 203.90625 to 218.75 MHz reference signal 206 to the outdoor radio equipment from the indoor modem. In exemplary embodiments, this arrangement can permit utilization of an IF range, for example, a 950 MHz to 1450 MHz, to receive signals 220 from the outdoor radio equipment by the indoor modem. As such, a multiplexed signal 212 disposed on an IFL can include the reference signal 206, a first guard band 222, the received signals 220, a second guard band 224 and the IF signal 204. No frequency overlap occurs, thereby making use of a single IFL cable without interference. In exemplary embodiments, the first guard band 222 may have a frequency range of about 200 MHz or more, about 300 MHz or more, about 400 MHz or more, about 500 MHz or more, about 600 MHz or more, or the like. In exemplary embodiments, the second guard band 224 may have a frequency range of about 200 MHz or more, about 300 MHz or more, about 400 MHz or more, about 500 MHz or more, or the like. In exemplary embodiments, the reference signal 206 and the IF signal 204 are manipulated by the outdoor equipment to generate an RF Output signal, for example, a sub-band of the frequency band ranging from 28.1 to 30 GHz.

Figure 3:
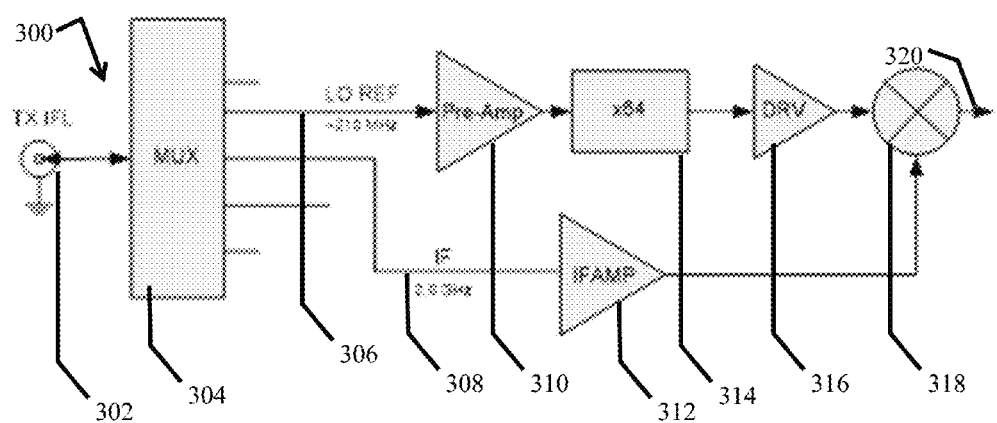
FIG. 3 illustrates a logical view of the radio equipment using linear radio technology, according to various embodiments.

FIG. 3 illustrates a logical view of the radio equipment using linear radio technology, according to various embodiments. A radio 300 uses a single IFL with an IFL connector 302. In exemplary embodiments, the IFL connector 302 connects to a coaxial cable. The radio 300 may include a multiplexor 304, a pre-amplifier 301, an intermediate frequency amplifier 312, a radio frequency multiplier 314, a driver 316 and a mixer 320.

The multiplexor 304 may separate a multiplexed signal received by the IFL connector 302 to provide a LO reference signal 306 to the pre-amplifier 310. In exemplary embodiments, the LO reference signal 306 may include a frequency band centered on approximately 210 MHz.

The multiplexor 304 may separate a multiplexed signal received by the IFL connector 302 to provide an IF signal 308 to the IF amplifier 312. In exemplary embodiments, the IF signal 308 may include a frequency band centered on approximately 2 GHz.

The LO reference signal 306 (also known as a Low Frequency Local Oscillator Reference signal) may be multiplied with the radio frequency multiplier 314 by a factor of 128 (or 64 with a sub-harmonic mixer). As such, a RF signal 320 may be output to air by tuning the mixer 318 output frequency from 28.1 to 30 GHz, by adjusting the LO reference signal 306, for example, from 203.90625 MHz to 218.75 MHz, when the IF signal is fixed at 2.0 GHz.

Various embodiments reduce a cost of installing a VSAT system by allowing the use of a single IFL between a VSAT system modem and an outdoor unit. Further, the various embodiments use standard semiconductor chips, thereby keeping costs down. In some implementations, the standard semiconductor chips may conform to a standard such as, for example, a DVB-S2 standard.

CONCLUSION

Although the subject matter has been described in language specific to structural features and/or methodological acts, it is to be understood that the subject matter in the appended claims is not necessarily limited to the specific features or acts described above. Rather, the specific features and acts described above are disclosed as example forms for implementing the claims.

Although the above descriptions may contain specific details, they should not be construed as limiting the claims in any way. Other configurations of the described embodiments are part of the scope of this disclosure. Further, implementations consistent with the subject matter of this disclosure may have more or fewer acts than as described, or may implement acts in a different order than as shown. Accordingly, the appended claims and their legal equivalents should only define the invention, rather than any specific examples given.

We claim as our invention:

1. A linear technology radio comprising:
 a pre-amplifier to amplify a Local Oscillator (LO) reference signal;
 an intermediate frequency (IF) amplifier to amplify an IF signal;
 a frequency multiplier to multiply the LO reference signal; and
 a mixer to mix the amplified LO reference signal and the amplified IF signal to generate a Radio Frequency (RF) signal,
 wherein a frequency band of the IF signal is fixed, a frequency band of the LO reference signal is variable, and a highest frequency of the frequency band of the LO reference signal is less than a lowest frequency of the frequency band of the IF signal, and
 wherein the frequency band of the LO reference signal ranges from 203.90625 MHz to 218.75 MHz, the frequency of the IF signal is centered on 2 GHz and a frequency band of the RF signal ranges from 28.1 GHz to 30 GHz.

2. The linear technology radio of claim 1, wherein the frequency band of the IF signal is centered on 2 Giga Hertz (GHz).

3. The linear technology radio of claim 1, wherein the frequency band of the LO reference signal is centered on 210 Mega Hertz (MHz).

4. The linear technology radio of claim 1, wherein a frequency band of the RF signal is centered on 29 GHz.

5. The linear technology radio of claim 1, wherein the frequency band of the LO reference signal is centered on 210 MHz, the frequency band of the IF signal is centered on 2 GHz and a frequency band of the RF signal is centered on 29 GHz.

6. The linear technology radio of claim 1, further comprising a multiplexor to separate a multiplexed signal into the LO reference signal and the IF signal.

7. The linear technology radio of claim 6, further comprising an IF received signal based on a received RF signal, wherein the multiplexor multiplexes the IF received signal with the multiplexed signal.

8. The linear technology radio of claim 7, wherein the frequency band of the LO reference signal is separated by a guard band of 500 MHz or more from the frequency band of the IF signal, and the frequency band of the IF signal is separated by a guard band of 500 MHz or more from a frequency band of the IF received signal.

9. The linear technology radio of claim 7, wherein a frequency band of the IF received signal ranges from 950 MHz to 1450 MHz.

10. A machine-implemented method performed by a linear technology radio, the method comprising:
 amplifying a Local Oscillator (LO) reference signal;
 amplifying an intermediate frequency (IF) signal;
 frequency multiplying the LO reference signal; and
 mixing the amplified LO reference signal and the amplified IF signal to generate a Radio Frequency (RF) signal,
 wherein a frequency band of the IF signal is fixed, a frequency band of the LO reference signal is variable, and a highest frequency of the frequency band of the LO reference signal is less than a lowest frequency of the frequency band of the IF signal, and
 wherein the frequency band of the LO reference signal ranges from 203.90625 MHz to 218.75 MHz, the frequency the IF signal is centered on 2 GHz and a frequency band of the RF signal ranges from 28.1 GHz to 30 GHz.

11. The method of claim 10, wherein the frequency band of the IF signal is centered on 2 Giga Hertz (GHz).

12. The method of claim 10, wherein the frequency band of the LO reference signal is centered on 210 Mega Hertz (MHz.

13. The method of claim 10, wherein an RF output frequency band of the radio is centered on 29 GHz.

14. The method of claim 10, wherein the frequency band of the LO reference signal is centered on 210 MHz, the frequency band of the IF signal is centered on 2 GHz and a frequency band of the RF signal is centered on 29 GHz.

15. The method of claim 10, further comprising separating a multiplexed signal into the LO reference signal and the IF signal.

16. The method of claim 15, further comprising multiplexing the multiplexed signal with an IF received signal based on a received RF signal.

17. The method of claim 16, wherein the frequency band of the LO reference signal is separated by a guard band of 500 MHz or more from the frequency band of the IF signal, and the frequency band of the IF signal is separated by a guard band of 500 MHz or more from a frequency band of the IF received signal.

18. The method of claim 16, wherein a frequency band of the IF received signal ranges from 950 MHz to 1450 MHz.

* * * * *